RELAY CIRCUITS

Filed May 13, 1964

INVENTOR
JOHN PAUL JONES, JR.

BY Watson, Cole, Grindle & Watson
ATTORNEYS 3,339,110

RELAY CIRCUITS

John Paul Jones, Jr., Wynnewood, Pa., assignor to Navigational Computer Corporation, Norristown, Pa., a corporation of Pennsylvania Filed May 13, 1964, Ser. No. 367,009
3 Claims. (Cl. 317—11)

ABSTRACT OF THE DISCLOSURE

A relay is provided with a silicon controlled rectifier or similar electronic discharge device which is temporarily fired during the relay contact closure period to effectively eliminate bounce and contact arcing. The temporary firing can be effected by a capactior or inductor energized as the relay coil is energized from the D-C current source.

This invention relates to switching circuits and more particularly it relates to electronic circuits employing relay contact closures.

Employment of relay switching circuits has, in the past, been restricted to those applications which are not sensitive to contact bounce. Thus, switching relay circuits have limited usage in digital logic systems, for example.

Furthermore, it takes such a long finite time delay for relay contacts to close after energization of the magnet coil, that in many cases relays cannot meet the desired switching speed requirements.

However, the most serious shortcoming of relay contact switching circuits is limited reliable life, mostly attributed to pitting and wear of contacts. Contact bounce contributes significantly to a shortened contact life by permitting excessive arcing with resulting erosion and probable erroneous operation. In this respect, armatures and contact areas have been ruggedized resulting in far bigger and far slower relays than otherwise required for a particular application.

Employment of fast closing solid state electronic devices such as transistors rather than relay contacts in switching circuits has thus taken place. However, in many cases, where high currents are encountered, transistor circuits become impractical in terms of power dissipation and the methods of cooling that are required. Also, high current carrying switching devices such as silicon controled rectifiers, while they may be switched on quickly, require complex switch-off circuits since after discharge the trigger electrode loses control. Thus it is, in many cases, economical and desirable to employ relay contact switching circuits if the above-mentioned problems can be overcome.

A particular advantage in using relay switching circuits is the complete circuit isolation of the contact circuits from the control winding circuits, as contrasted with semiconductor circuits wherein a control or trigger electrode is not completely isolated from the discharge path.

Thus, it is a general objective of this invention to provide an improved high-speed, high-current switching circuit.

Another object of the invention is to provide a relay switching circuit with high current capacity while eliminating contact bounce effects.

A further object of the invention is to provide a high-current capacity relay contact circuit which switches instantaneously.

A still further object of the invention is to employ a high-current switching circuit completely isolating the load circuit from the switching control circuit.

Yet another object of the invention is to provide a small relay with high current carrying capacity.

Therefore, in accordance with this invention, a relay is employed with an auxiliary circuit shunting the current carrying contacts to cure deficiencies in closing time and bounce. This permits a small fast inexpesive relay to be employed for instantaneously switching very high currents.

The shunting circuit comprises a discharge device which discharges responsive to application of a closure current to the relay coil and thereafter carries the contact current temporarily when the contacts bounce. An auxiliary relay coil is used to trigger the discharge device into conduction when the coil is energized to permit isolation of the auxiliary circuit in the current carrying circuit of the relay contacts, thereby preserving the isolation quality of a relay circuit.

These and other features and advantages of the invention will be described in a more detailed description referring to the accompanying drawing, in which.

Figure 1:
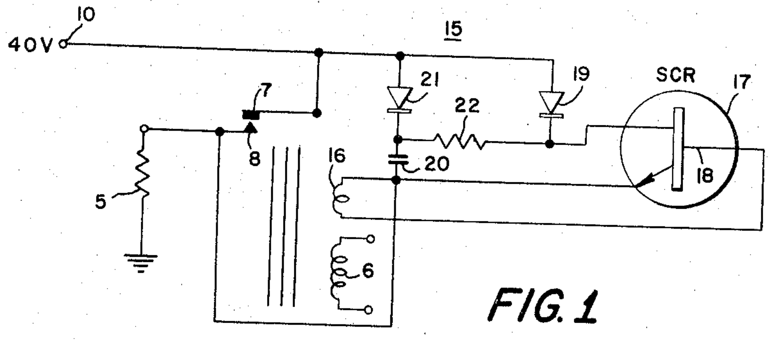
FIGURE 1 is a schematic circuit diagram of an embodiment of the invention.
Figure 2:
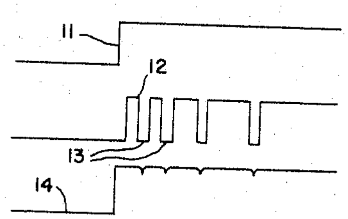
FIGURE 2 is a waveform chart illustrating the operation of the invention.

The embodiment of FIGURE 1 has a relay with energizing coil 6 operating to close contacts 7 and 8 to connect a load such as resistor 5 at output terminal 9 with the direct current source at terminal 10. When coil 6 is energized with a pulse waveform as shown at 11 in FIGURE 2, the contacts will tend close at 12 after a delay, but will continue to bounce and reopen at 13, etc. for several cycles.

However, the idealized waveform 14 is attained by use of an auxiliary discharge circuit 15 coupled across contacts 7 and 8. Auxiliary trigger winding 16 is inductively coupled with operating coil 6 in such sense that the silicon controlled rectifier (SCR) 17 is discharged via its trigger electrode 18. The SCR operates as an open circuit when coupled across a direct current source, until "Fired" by a trigger potential. Thereafter, it remains conductive until extinguished by reducing current below a threshold value such as by short circuiting the discharge path. Thus, as seen on waveform 14, when the coil 6 is energized (11), the discharge path of SCR 17 is instantaneously coupled across contacts 7 and 8 through discharge diode 19 to carry the full load current until the contacts initially close (12).

While the contacts 7, 8 are open, discharge sustaining capacitor 20 fully charges from source terminal 10 through charging diode 21. Thus, as the contacts 7, 8 close (12), the storage facility of capacitor 20 through resistor 22 provides sustaining current to the SCR 17 to prevent its extinction for a time period (CR), such as ten milliseconds, extending over the expected duration of the contact bounce period. Thus, each time the contacts bounce open (13, etc.) the SCR carries substantially the entire load current as shown by the serrations in waveform 14.

It is evident, therefore, that the circuit operates instantaneously and without any contact bounce effect. Since the SCR 17 only is used during the energization period, intermittently, it need have little power dissipation capacity for handling large instantaneous currents. Similarly, the relay and contacts need be of only nominal size, since pitting and arcing of contacts is completely eliminated. Also, the relay contacts serve automatically to extinguish the SCR 17, so that the advantages of both devices are retained without the disadvantages of either. Note also that the load circuit is completely isolated from energizing coil 6 by the floating circuit connections of trigger winding 16. This coil is connected in proper polarity to trigger SCR 17 only when the coil is energized, so that deenergization occurs instantaneously when the relay contacts are initially reopened. At that time there is no bounce, and capacitor 20 recharges for another operating cycle.

Figure 3:
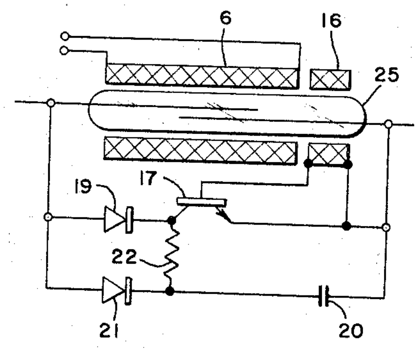
FIGURES 3 and 4 are diagrammatic examples of relays operable in accordance with the invention.

As may be seen from FIGURE 3, even a small reed type magnetic contact set 25 may be used to carry exceptionally high current capacity in high speed switching circuits or logic applications where contact bounce might otherwise be intolerable.

Figure 4:
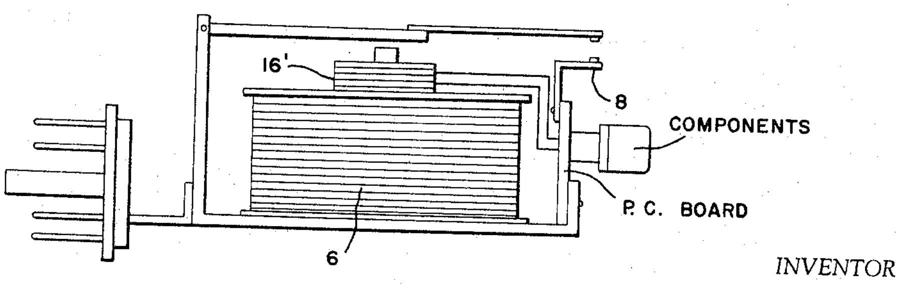

FIGURE 4 illustrates the manner of adapting a conventional relay with an auxiliary coil 16′ to operate in accordance with the teachings of this invention. In each case the complete contact isolation is maintained by the use of an inductively coupled trigger coil so that the switching circuit is not conductively coupled to other circuits by resistive paths such as encountered when using a SCR or transistor directly, for example.

Accordingly, it is evident that the present invention provides an unique switching circuit with superior performance characteristics, wherein features of novelty are defined with particularity in the following claims.

I claim:

1. A switching circuit comprising in combination, a relay having a pair of contacts and an energizing coil for closing the contacts, a semiconductor discharge device having an unidirectional discharge path and a discharge trigger electrode, a coupling circuit between the energizing coil and the trigger electrode coupled for conveying a trigger potential of the requisite polarity to establish a discharge in the device when said coil is energized, a discharge sustaining circuit coupling said discharge path across said set of contacts to provide discharge current when said contacts are open, a load device, and a direct current source coupled to the load device and said contacts wherein the coupling circuit comprises an auxiliary coil inductively coupled to said energizing coil.

2. A switching circuit comprising in combination, a relay having a pair of contacts and an energizing coil for closing the contacts, a semiconductor discharge device having a unidirectional discharge path and a discharge trigger electrode, a coupling circuit between the energizing coil and the trigger electrode coupled for conveying a trigger potential of the requisite polarity to establish a discharge in the device when said coil is energized, a discharge sustaining circuit coupling said discharge path across said set of contacts to provide discharge current when said contacts are open, a load device, and a direct current source coupled to the load device and said contacts, wherein the discharge sustaining circuit comprises a capacitor connected between the contacts to thereby become charged from said source when the contacts are opened, and a resistor coupling said discharge path to said capacitor to provide a time constant sufficient to provide discharge sustaining current to said device over the normal bounce period of said relay.

3. A circuit as defined in claim 3, wherein one diode is coupled serially with said capacitor between the contacts and a further diode connects said discharge path across said contacts.

References Cited

UNITED STATES PATENTS

| | | | |
|---|---|---|---|
| 2,665,396 | 1/1954 | Weinfurt | 317—11.4 |
| 2,789,253 | 4/1957 | Vang | 317—11.4 |
| 3,184,619 | 5/1965 | Zydney | 307—136 X |
| 3,193,711 | 7/1965 | Western | 317—148.53 |
| 3,237,030 | 2/1966 | Coburn | 307—136 X |
| 3,309,570 | 3/1967 | Goldberg | 317—11 |

MILTON O. HIRSHFIELD, *Primary Examiner.*

L. T. HIX, *Assistant Examiner.*